US012444623B2

(12) United States Patent
Hirase et al.

(10) Patent No.: US 12,444,623 B2
(45) Date of Patent: Oct. 14, 2025

(54) SUBSTRATE PROCESSING SYSTEM AND SUBSTRATE PROCESSING METHOD

(71) Applicant: Tokyo Electron Limited, Tokyo (JP)

(72) Inventors: Keita Hirase, Kumamoto (JP); Yukiyoshi Saito, Kumamoto (JP); Akihiro Teramoto, Kumamoto (JP); Koji Tanaka, Kumamoto (JP); Shota Takei, Kumamoto (JP); Masataka Gosho, Kumamoto (JP); Kazuaki Kitamura, Kumamoto (JP); Shinichi Ikeda, Kumamoto (JP); Shunsuke Kurizaki, Kumamoto (JP); Yuji Kimura, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 361 days.

(21) Appl. No.: 18/115,738

(22) Filed: Feb. 28, 2023

(65) Prior Publication Data
US 2023/0282493 A1 Sep. 7, 2023

(30) Foreign Application Priority Data

Mar. 2, 2022 (JP) .................. 2022-032093
Nov. 8, 2022 (JP) .................. 2022-179026

(51) Int. Cl.
*H01L 21/67* (2006.01)
*H01L 21/311* (2006.01)
(Continued)

(52) U.S. Cl.
CPC .. *H01L 21/67086* (2013.01); *H01L 21/31111* (2013.01); *H01L 21/67028* (2013.01);
(Continued)

(58) Field of Classification Search
CPC ......... H01L 21/67086; H01L 21/31111; H01L 21/67028; H01L 21/67051; H01L 21/6708;
(Continued)

(56) References Cited

U.S. PATENT DOCUMENTS 11,978,644 B2 * 5/2024 Kanagawa ........ H01L 21/67766
12,322,631 B2 * 6/2025 Tsuchiya ........... H01L 21/67276
(Continued)

FOREIGN PATENT DOCUMENTS

JP 2021-064654 A 4/2021
JP 2025036926 A * 3/2025 ....... H01L 21/67721

*Primary Examiner* — Jeffrie R Lund
(74) *Attorney, Agent, or Firm* — Venjuris, P.C.

(57) ABSTRACT

A substrate processing system includes: a carry-in/out section in which a cassette accommodating a plurality of substrates is carried in/out; a batch processing section in which a wafer lot including the plurality of substrates is collectively processed in a state where each of the plurality of substrates stand upright; a single-wafer processing section in which the plurality of substrates included in the wafer lot are processed one by one in a horizontal state; and an interface section that delivers the plurality of substrates from the batch processing section to the single-wafer processing section. The interface section includes: a standby table that horizontally holds a substrate in a state of being in contact with pure water; and a transfer mechanism that delivers the substrate from the batch processing section to the standby table.

15 Claims, 16 Drawing Sheets

(51) Int. Cl.
*H01L 21/677* (2006.01)
*H01L 21/687* (2006.01)

(52) U.S. Cl.
CPC .... *H01L 21/67051* (2013.01); *H01L 21/6708* (2013.01); *H01L 21/67718* (2013.01); *H01L 21/67766* (2013.01); *H01L 21/67778* (2013.01); *H01L 21/6875* (2013.01)

(58) Field of Classification Search
CPC ......... H01L 21/67718; H01L 21/67766; H01L 21/67778; H01L 21/6875; H01L 21/67196; H01L 21/6715; H01L 21/67161; H01L 21/67253; H01L 21/67742; H01L 21/67751
See application file for complete search history.

(56) References Cited

U.S. PATENT DOCUMENTS

| | | | |
|---|---|---|---|
| 2021/0111054 A1* | 4/2021 | Kanagawa | H01L 21/67757 |
| 2023/0268202 A1* | 8/2023 | Hirase | H01L 21/68707 |
| | | | 438/747 |
| 2023/0268213 A1* | 8/2023 | Tsuchiya | H01L 21/67276 |
| | | | 414/217 |
| 2023/0282493 A1* | 9/2023 | Hirase | H01L 21/67718 |
| 2024/0278437 A1* | 8/2024 | Song | B25J 13/089 |
| 2025/0140581 A1* | 5/2025 | Yamashita | H01L 21/67086 |

* cited by examiner

SUBSTRATE PROCESSING SYSTEM AND SUBSTRATE PROCESSING METHOD

CROSS-REFERENCE TO RELATED APPLICATIONS

This application is based on and claims priority from Japanese Patent Application Nos. 2022-032093 and 2022-179026, filed on Mar. 2, 2022 and Nov. 8, 2022, respectively, with the Japan Patent Office, the disclosures of which are incorporated herein in their entireties by reference.

TECHNICAL FIELD

The present disclosure relates to a substrate processing system and a substrate processing method.

BACKGROUND

A substrate processing system disclosed in Japanese Patent Laid-Open Publication No. 2021-064654 includes a batch processing section and a single-wafer processing section. The batch processing section holds a semiconductor wafer washed with water in the water. A plurality of semiconductor wafers is processed with a chemical liquid in a state of being placed on a single holding table. A transporting section picks up the semiconductor wafers one by one from a buffer bath and transports the semiconductor wafers to the single-wafer processing section. The single-wafer processing section dries the single semiconductor wafer transported by the transporting section while supporting the main surface of the single semiconductor wafer to be horizontal.

SUMMARY

A substrate processing system according to an aspect of the present disclosure includes: a carry-in/out section in which a cassette accommodating a plurality of substrates is carried in/out; a batch processing section in which a wafer lot including the plurality of substrates is collectively processed in a state where each of the plurality of substrates stand upright; a single-wafer processing section in which the plurality of substrates included in the wafer lot are processed one by one in a horizontal state; and an interface section that delivers the plurality of substrates from the batch processing section to the single-wafer processing section. The interface section includes; a standby table that horizontally holds a substrate in a state of being in contact with pure water; and a transfer mechanism that delivers the substrate from the batch processing section to the standby table.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
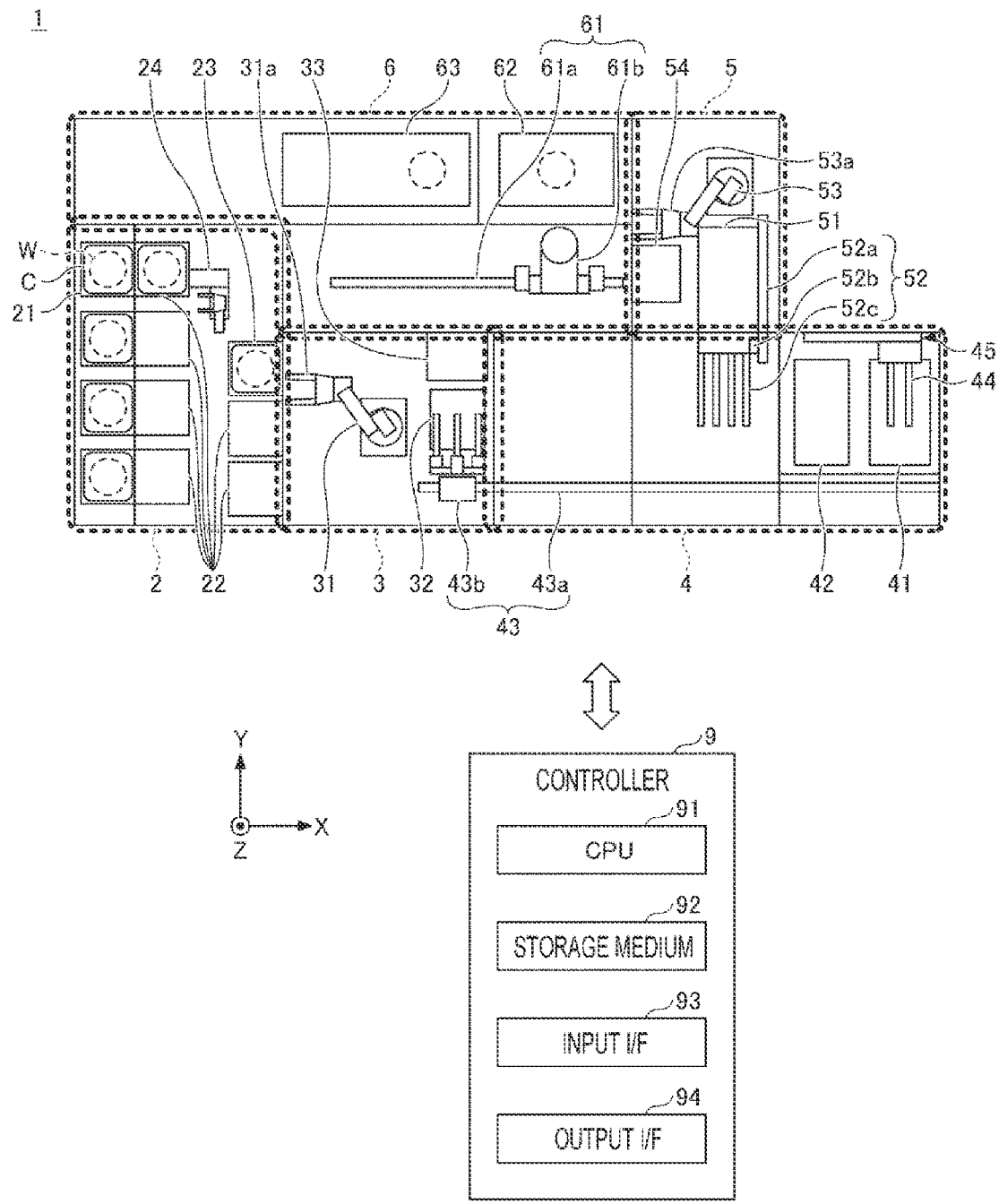
FIG. 1 is a schematic plan view illustrating a substrate processing system according to a first embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting embodiments of the present disclosure will be described with reference to the accompanying drawings. In all of the accompanying drawings, the same or corresponding members or parts are denoted by the same or corresponding reference numerals, and redundant explanations are omitted.

First Embodiment

First, a first embodiment will be described. The first embodiment relates to a substrate processing system.
(Substrate Processing System)

A substrate processing system according to an embodiment will be described with reference to FIG. 1. As illustrated in FIG. 1, a substrate processing system 1 according to the first embodiment includes a carry-in/out section 2, a first interface section 3, a batch processing section 4, a second interface section 5, a single-wafer processing section 6, and a controller 9.

The carry-in/out section 2 serves as both a carry-in section and a carry-out section. Therefore, the substrate processing system 1 may be miniaturized. The carry-in/out section 2 includes a load port 21, a stocker 22, a loader 23, and a cassette transfer device 24.

The load port 21 is disposed on a negative side of the carry-in/out section 2 in the X-axis direction. A plurality of (e.g., four) load ports 21 is disposed along the Y-axis direction. However, the number of the load ports 21 is not particularly limited. A cassette C is placed on the load port 21. The cassette C accommodates a plurality of (e.g., 25) substrates W, and is carried into/out from the load port 21. In the inside of the cassette C, the substrates W are held horizontally, and held in the vertical direction at a second pitch P2 that is N times a first pitch P1 (P2=N×P1). N is a natural number of 2 or more, and N is 2 in this embodiment, but N may be 3 or more.

A plurality of (e.g., four) stockers 22 is disposed in the center of the carry-in/out section 2 in the X-axis direction along the Y-axis direction. A plurality of (e.g., two) stockers 22 is disposed adjacent to the first interface section 3 along the Y-axis direction on a positive side of the carry-in/out section 2 in the X-axis direction. The stockers 22 may be disposed in multiple tiers in the vertical direction. The stocker 22 temporarily stores a cassette C that accommodates the substrates W before a cleaning processing is accommodated or an empty cassette C after the substrates Ware taken out. The number of the stockers 22 is not particularly limited.

The loader 23 is adjacent to the first interface section 3 and is disposed on the positive side of the carry-in/out section 2 in the X-axis direction. The cassette C is placed on the loader 23. The loader 23 is provided with a lid opening/closing mechanism (not illustrated) that opens/closes a lid of the cassette C. A plurality of loaders 23 may be provided. The loader 23 may be disposed in multiple tiers in the vertical direction.

The cassette transfer device 24 is, for example, an articulated transfer robot. The cassette transfer device 24 transfers the cassette C among the load port 21, the stocker 22, and the loader 23.

The first interface section 3 is disposed on the positive side of the carry-in/out section 2 in the X-axis direction. The first interface section 3 transfers the substrate W among the carry-in/out section 2, the batch processing section 4, and the single-wafer processing section 6. The first interface section 3 includes a substrate feeding device 31, a lot forming unit 32, and a first delivery table 33.

The substrate feeding device 31 transfers the substrate W among the cassette C placed on the loader 23, the lot forming unit 32, and the first delivery table 33. The substrate feeding device 31 is constituted by a multi-axis (e.g., six-axis) arm robot, and includes a substrate holding arm 31*a* at a tip end thereof. The substrate holding arm 31*a* includes a plurality of holding claws (not illustrated) capable of holding a plurality of (e.g., 25) substrates W. The substrate holding arm 31*a* may take any position and posture in the three-dimensional space while holding the substrate W by the holding claws.

The lot forming unit 32 is disposed on the positive side of the first interface section 3 in the X-axis direction. The lot forming unit 32 holds a plurality of substrates W at the first pitch P1, and forms a lot L.

The first delivery table 33 is adjacent to the single-wafer processing section 6 and is disposed on the positive side of the first interface section 3 in the X-axis direction. The first delivery table 33 receives the substrate W from a fourth transfer device 61 and temporarily stores the substrate W until it is delivered to the carry-in/out section 2.

The batch processing section 4 is disposed on the positive side of the first interface section 3 in the X-axis direction. That is, the carry-in/out section 2, the first interface section 3, and the batch processing section 4 are disposed in this order from the negative side in the X-axis direction to the positive side in the X-axis direction. The batch processing section 4 collectively processes the lot L including a plurality of (e.g., 50 or 100) substrates W at the first pitch P1. One lot L is constituted by, for example, substrates W of M cassettes C. M is a natural number of 2 or more. M may be a natural number that is the same as N, or a natural number different from N. The batch processing section 4 includes a chemical liquid bath 41, a rinse liquid bath 42, a first transfer device 43, a processing mechanism 44, and a driving device 45.

The chemical liquid bath 41 and the rinse liquid bath 42 are disposed along the X-axis direction. For example, the chemical liquid bath 41 and the rinse liquid bath 42 are arranged in this order from the positive side in the X-axis direction toward the negative side in the X-axis direction. The chemical liquid bath 41 and the rinse liquid bath 42 are also collectively referred to as a processing bath. The number of the chemical liquid baths 41 and the number of the rinse liquid baths 42 are not limited to those in FIG. 1. For example, one set of the chemical liquid bath 41 and the rinse liquid bath 42 is illustrated in FIG. 1, but a plurality of sets may be provided.

The chemical liquid bath 41 stores a chemical liquid in which the lot L is immersed. The chemical liquid is, for example, a phosphoric acid aqueous solution $H_3PO_4$. The phosphoric acid aqueous solution selectively etches and removes a silicon nitride film between a silicon oxide film and the silicon nitride film. The chemical liquid is not limited to the phosphoric acid aqueous solution. For example, a dilute hydrofluoric acid (DHF), a mixed liquid of hydrofluoric acid and ammonium fluoride (BHF), a dilute sulfuric acid, a mixed liquid of sulfuric acid, hydrogen peroxide, and water (SPM), a mixed liquid of ammonia, hydrogen peroxide, and water (SC1), a mixed liquid of hydrochloric acid, hydrogen peroxide, and water (SC2), a mixed liquid of tetramethylammonium hydroxide and water (TMAH), or a plating liquid. The chemical liquid may be for a peeling processing or a plating processing. The number of the chemical liquids is not particularly limited, and may be plural.

The rinse liquid bath 42 stores a first rinse liquid in which the lot L is immersed. The first rinse liquid is pure water (e.g., deionized water (DIW)) that removes the chemical liquid from the substrate W.

The first transfer device 43 includes a guide rail 43*a* and a first transfer arm 43*b*. The guide rail 43*a* is disposed on the negative side of the processing bath in the Y-axis direction. The guide rail 43*a* extends from the first interface section 3 to the batch processing section 4 along the horizontal direction (e.g., X-axis direction). The first transfer arm 43*b* moves in the horizontal direction (e.g., X-axis direction) along the guide rail 43*a*. The first transfer arm 43*b* may move in the vertical direction, or may rotate around a vertical axis. The first transfer arm 43*b* collectively transfers the lot L between the first interface section 3 and the batch processing section 4.

The processing mechanism 44 receives and holds the lot L from the first transfer arm 43*b*. The processing mechanism 44 holds a plurality of substrates W in the Y-axis direction at the first pitch P1, and vertically holds each of the plurality of substrates W.

The driving device 45 moves the processing mechanism 44 in the X-axis direction and in the Z-axis direction. The processing mechanism 44 immerses the lot L in the chemical liquid stored in the chemical liquid bath 41, and immerses the lot L in the first rinse liquid stored in the rinse liquid bath 42, and then, delivers the lot L to the first transfer device 43.

The number of units of the processing mechanism 44 and the driving device 45 is one in this embodiment, but may be two or more. In the latter case, one unit immerses the lot L in the chemical liquid stored in the chemical liquid bath 41, and another unit immerses the lot L in the first rinse liquid stored in the rinse liquid bath 42. In this case, the driving device 45 may move the processing mechanism 44 in the Z-axis direction, and may not move the processing mechanism 44 in the X-axis direction.

The second interface section 5 is disposed on the positive side of the batch processing section 4 in the Y-axis direction. The second interface section 5 transfers the substrate W between the batch processing section 4 and the single-wafer processing section 6. The second interface section 5 includes an immersion bath 51, a second transfer device 52, a third transfer device 53, and a second delivery table 54.

The immersion bath 51 is disposed outside the movement range of the first transfer arm 43*b*. For example, the immersion bath 51 is disposed at a position deviated from the processing bath to the positive side in the Y-axis direction. The immersion bath 51 stores a second rinse liquid in which the lot L is immersed. The second rinse liquid is, for example, deionized water (DIW). The substrate W is held in the second rinse liquid until the substrate W is lifted from the second rinse liquid by the third transfer device 53. Since the substrate W exists below the liquid surface of the second rinse liquid, the surface tension of the second rinse liquid does not act on the substrate W, and thus, the uneven pattern of the substrate W may be prevented from collapsing.

The second transfer device 52 includes a Y-axis driving device 52*a*, a Z-axis driving device 52*b*, and a second transfer arm 52*c*.

The Y-axis driving device 52*a* is disposed on the positive side of the second interface section 5 in the X-axis direction. The Y-axis driving device 52*a* extends from the second interface section 5 to the batch processing section 4 along the horizontal direction (e.g., Y-axis direction). The Y-axis driving device 52*a* moves the Z-axis driving device 52*b* and the second transfer arm 52*c* in the Y-axis direction. The Y-axis driving device 52*a* may include a ball screw.

The Z-axis driving device 52*b* is movably attached to the Y-axis driving device 52*a*. The Z-axis driving device 52*b* moves the second transfer arm 52*c* in the Z-axis direction. The Z-axis driving device 52*b* may include a ball screw.

The second transfer arm 52*c* is movably attached to the Z-axis driving device 52*b*. The second transfer arm 52*c* receives and holds the lot L from the first transfer arm 43*b*. The second transfer arm 52*c* holds a plurality of substrates W in the Y-axis direction at the first pitch P1, and vertically holds each of the plurality of substrates W. The second transfer arm 52*c* is moved in the Y-axis direction and in the Z-axis direction by the Y-axis driving device 52*a* and the Z-axis driving device 52*b*. The second transfer arm 52*c* is configured so as to be movable to a plurality of positions including a delivery position A1, an immersion position A2, and a standby position A3 illustrated in FIG. 7.

The delivery position A1 is a position where the delivery of the lot L between the first transfer arm 43*b* and the second transfer arm 52*c* is performed. The delivery position A1 is a position on the negative side in the Y-axis direction and on the positive side in the Z-axis direction.

The immersion position A2 is a position where the lot L is immersed in the immersion bath 51. The immersion position A2 is a position on the positive side in the Y-axis direction and on the negative side in the Z-axis direction from the delivery position A1.

The standby position A3 is a position where the second transfer arm 52*c* stands by when the delivery of the lot L and the immersion of the lot L into the immersion bath 51 are not performed. The standby position A3 is a position immediately below (e.g., negative side in the Z-axis direction) the delivery position A1, and a position that does not hinder the movement of the first transfer arm 43*b*. In this case, since the second transfer arm 52*c* may be moved to the delivery position A1 only by moving upward (e.g., positive side in the Z-axis direction), the throughput is improved. The standby position A3 may be the same position as the immersion position A2. In this case, it is possible to prevent particles that may be generated as the first transfer device 43 is operated from adhering to the second transfer arm 52*c*. The standby position A3 may be a position immediately above (e.g. positive side in the Z-axis direction) the immersion position A2. As described above, it is possible to prevent the first transfer arm 43*b* and the second transfer arm 52*c* from being in contact with each other by setting the standby position A3 to a position different from that of the delivery position A1.

The second transfer device 52 as described above moves the second transfer arm 52*c* to the immersion position A2 or the standby position A3 while the first transfer device 43 is being operated. As a result, it is possible to prevent the first transfer arm 43*b* and the second transfer arm 52*c* from being in contact with each other.

The third transfer device 53 is constituted by a multi-axis (e.g., six-axis) arm robot, and includes a third transfer arm 53*a* at a tip thereof. The third transfer arm 53*a* includes a holding claw (not illustrated) capable of holding one substrate W. The third transfer arm 53*a* may take any position and posture in the three-dimensional space while holding the substrate W by the holding claw. The third transfer device 53 transfers the substrate W between the second transfer arm 52*c* at the immersion position A2 and the second delivery table 54. At this time, since the immersion bath 51 is disposed outside the movement range of the first transfer arm 43*b*, the first transfer arm 43*b* and the third transfer arm 53*a* do not interfere with each other. As a result, it is possible to independently operate one of the first transfer device 43 and the third transfer device 53 regardless of the operation state of the other. Therefore, since the first transfer device 43 and the third transfer device 53 may be operated at an arbitrary timing, it is possible to shorten the time required for transferring the substrate W. As a result, the productivity of the substrate processing system 1 is improved. The third transfer device 53 functions as an example of a transfer mechanism.

The second delivery table 54 is adjacent to the single-wafer processing section 6 and is disposed on the negative side of the second interface section 5 in the X-axis direction. The second delivery table 54 receives the substrate W from the third transfer device 53 and temporarily stores the substrate W until it is delivered to the single-wafer processing section 6. That is, the substrate W taken out from the immersion bath 51 is placed on the second delivery table 54. The substrate W placed on the second delivery table 54 may be, for example, in a state where the surface is wet with the second rinse liquid. In this case, the surface tension of the second rinse liquid does not act on the substrate W, and thus, the uneven pattern of the substrate W may be suppressed from collapsing. The number of the second delivery tables 54 may be one, but may be two or more. Details of the second delivery table 54 will be described later.

The single-wafer processing section 6 is disposed on the negative side of the second interface section 5 in the X-axis direction and on the positive side of the carry-in/out section 2, the first interface section 3, and the batch processing section 4 in the Y-axis direction. The single-wafer processing section 6 processes the substrate W one by one. The single-wafer processing section 6 includes a fourth transfer device 61, a liquid processing device 62, and a drying device 63.

The fourth transfer device 61 includes a guide rail 61a and a fourth transfer arm 61b. The guide rail 61a is disposed on the negative side of the single-wafer processing section 6 in the Y-axis direction. The guide rail 61a extends in the single-wafer processing section 6 along the horizontal direction (e.g., X-axis direction). The fourth transfer arm 61b moves in the horizontal direction (e.g., X-axis direction) and the vertical direction along the guide rail 61a, and rotates around the vertical axis. The fourth transfer arm 61b transfers the substrate W among the second delivery table 54, the liquid processing device 62, the drying device 63, and the first delivery table 33. The number of the fourth transfer arms 61b may be one, or two or more. In the latter case, the fourth transfer device 61 collectively transfers a plurality of (e.g., 5) substrates W.

The liquid processing device 62 is disposed on the positive side in the X-axis direction and on the positive side in the Y-axis direction of the single-wafer processing section 6. The liquid processing device 62 is a single-wafer type, and processes the substrate W with the processing liquid one by one. The liquid processing device 62 is disposed in multiple tiers (e.g., three tiers) in the vertical direction (e.g., Z-axis direction). As a result, a plurality of substrates W may be processed with the processing liquid at the same time. A plurality of processing liquids may be used. For example, the processing liquids may include pure water such as DIW, and a drying liquid having a lower surface tension than the pure water. The drying liquid may be, for example, alcohol such as isopropyl alcohol (IPA).

The drying device 63 is disposed adjacent to the negative side of the liquid processing device 62 in the X-axis direction. In this case, the end portion surface of the single-wafer processing section 6 on the positive side in the Y-axis direction may be disposed to be flush with, or substantially flush with the end surface of the second interface section 5 on the positive side in the Y-axis direction. Therefore, since a dead space hardly occurs, the footprint of the substrate processing system 1 may be reduced. With regard to this, when the drying device 63 is disposed adjacent to the positive side of the liquid processing device 62 in the Y-axis direction, the end portion surface of the single-wafer processing section 6 on the positive side in the Y-axis direction protrudes from the end portion surface of the second interface section 5 on the positive side in the Y-axis direction, which may occur a dead space. The drying device 63 is a single-wafer type, and dries the substrate W with a supercritical fluid one by one. The drying device 63 is disposed in multiple tiers (e.g., three tiers) in the vertical direction. As a result, a plurality of substrates W may be dried at the same time.

Both the liquid processing device 62 and the drying device 63 may not be a single-wafer type, or the liquid processing device 62 may be a single-wafer type and the drying device 63 may be a batch type. The drying device 63 may collectively dry a plurality of substrates W with the supercritical fluid. The number of the substrates W that are collectively processed in the drying device 63 may be more than the number of the substrates W that are collectively processed in the liquid processing device 62, or may be less. Devices other than the liquid processing device 62 and the drying device 63 may be disposed in the single-wafer processing section 6.

The controller 9 is, for example, a computer, and includes a central processing unit (CPU) 91 and a storage medium 92 such as a memory. The storage medium 92 stores a program that controls various processings performed in the substrate processing system 1. The controller 9 controls the operation of the substrate processing system 1 by causing the CPU 91 to execute the programs stored in the storage medium 92. The controller 9 includes an input interface 93 and an output interface 94. The controller 9 receives a signal from the outside through the input interface 93, and sends a signal to the outside from the output interface 94.

The programs are stored in, for example, a computer-readable storage medium, and installed from the storage medium to the storage medium 92 of the controller 9. For example, the computer-readable recording medium may be a hard disk (HD), a flexible disk (FD), a compact disk (CD), a magnet optical disk (MO), or a memory card. The programs may be downloaded from a server through the Internet, and installed in the storage medium 92 of the controller 9.

In the substrate processing system 1, the substrate W is transferred from the carry-in/out section 2 to the first interface section 3, the batch processing section 4, the second interface section 5, and the single-wafer processing section 6, and is returned to the carry-in/out section 2.

(Details of Configuration of Second Delivery Table)

Figure 2A:
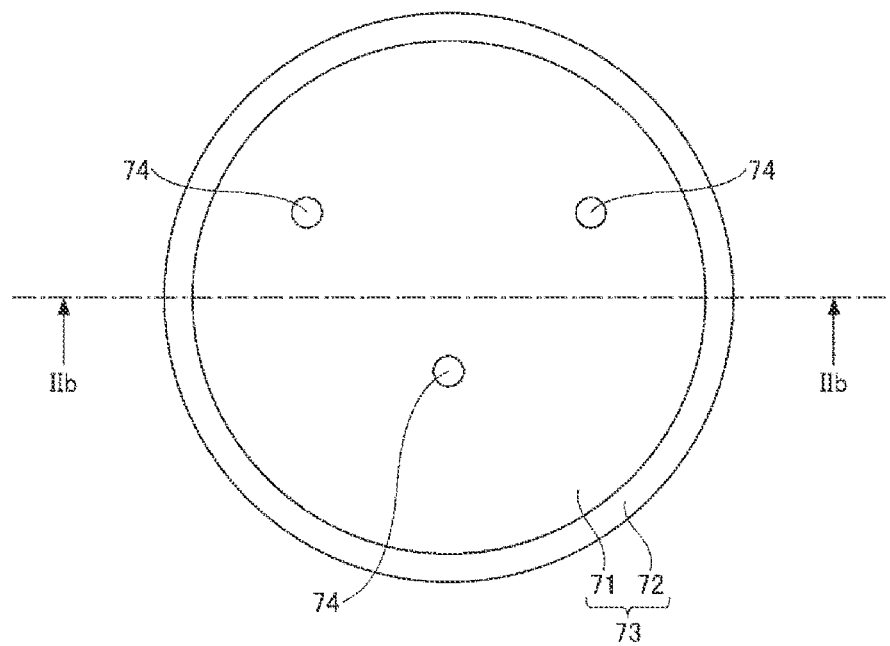
FIGS. 2A and 2B are views illustrating a second delivery table of the first embodiment.
Figure 2B:
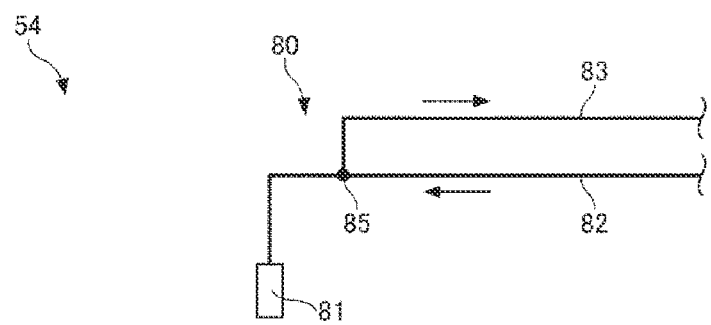
Figure 2B:

Details of a configuration of the second delivery table 54 will be described with reference to FIGS. 2A and 2B. FIGS. 2A and 2B are views illustrating the second delivery table 54 of the first embodiment. FIG. 2A is atop view and FIG. 2B is across-sectional view. FIG. 2B corresponds to a cross-sectional view taken along a line IIb-IIb in FIG. 2A.

As illustrated in FIGS. 2A and 2B, the second delivery table 54 includes a pure water supply unit 80, a liquid receiving portion 73, and three or more pins 74. In FIG. 2A, the pure water supply unit 80 is omitted.

The liquid receiving portion 73 includes a bottom plate 71 and a wall portion 72. The bottom plate 71 has a disc shape. The wall portion 72 is provided in an annular shape on the bottom plate 71. The pins 74 are provided on the bottom plate 71. In the present embodiment, the number of the pins 74 is three, but may be four or more. The three pins 74 are disposed to form an equilateral triangle in plan view. A plane including an upper end of each pin 74 is horizontal. The upper end of each pin 74 is positioned above an upper end of the wall portion 72. In plan view, the center of the equilateral triangle formed by the three pins 74 and the center of the disc-shaped bottom plate 71 substantially coincide. The pins 74 support the substrate W from below above the bottom plate 71. The pin 74 functions as an example of a support unit.

The pure water supply unit 80 includes a nozzle 81, a pure water supply line 82, and a return line 83. The pure water supply line 82 is connected to the nozzle 81. The nozzle 81 ejects pure water supplied through the pure water supply line 82. A branch point 85 is provided in the pure water supply line 82, and the return line 83 is connected to the branch point 85. Even during a period in which the ejection of the pure water from the nozzle 81 is not performed, the pure water flows through the portion of the pure water supply line 82 on the upstream side of the branch point 85 and the return line 83. The pure water supply unit 80 configured in this manner supplies the pure water to the upper surface of the substrate W.

The second delivery table 54 has such configuration, and horizontally holds the substrate W in a state of being in contact with pure water. The second delivery table 54 functions as an example of a standby table.

(Operation of Substrate Processing System)

Figure 3:
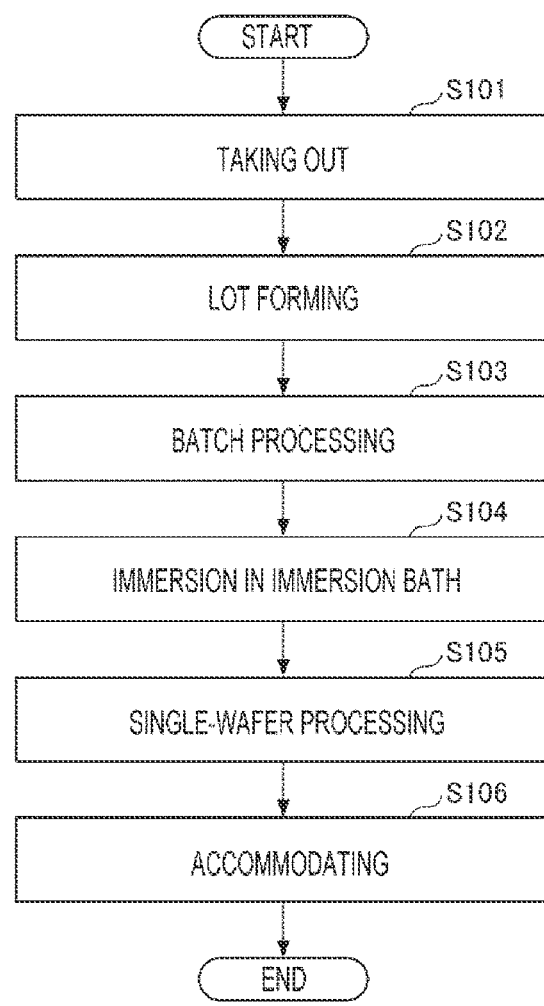
FIG. 3 is a flowchart illustrating a substrate processing method according to the first embodiment.

An operation of the substrate processing system 1 according to the first embodiment, that is, a substrate processing method will be described with reference to FIG. 3. The processing illustrated in FIG. 3 is performed under the control by the controller 9.

First, the cassette C is carried into the carry-in/out section 2 in a state of accommodating a plurality of substrates W, and is placed on the load port 21. In the inside of the cassette C, the substrates W are held horizontally, and held in the vertical direction at the second pitch P2 (P2=N×P1). N is a natural number of 2 or more, and N is 2 in this embodiment, but N may be 3 or more.

Next, the cassette transfer device 24 transfers the cassette C from the load port 21 to the loader 23. The lid of the cassette C transferred to the loader 23 is opened by the lid opening/closing mechanism.

Nest, the substrate feeding device 31 receives the substrate W accommodated in the cassette C (S101 in FIG. 3), and transfers the substrate W to the lot forming unit 32.

Next, the lot forming unit 32 holds a plurality of substrates W at the first pitch P1 (P1=P2/N), and forms the lot L (S102 in FIG. 3). One lot L is constituted by, for example, the substrates W of M cassettes C. Since the pitch of the substrate W is narrowed from the second pitch P2 to the first pitch P1, the number of the substrates W that are collectively processed may be increased.

Next, the first transfer device 43 receives the lot L from the lot forming unit 32, and transfers the lot L to the processing mechanism 44.

Next, the processing mechanism 44 is lowered from the above side of the chemical liquid bath 41 to immerse the lot L in the chemical liquid, thereby being processed with the chemical liquid (S103 in FIG. 3). Thereafter, the processing mechanism 44 is raised in order to lift up the lot L from the chemical liquid, and then, is moved in the horizontal direction (e.g., negative side in the X-axis direction) toward an upper side of the rinse chemical bath 42.

Next, the processing mechanism 44 is lowered from the upper side of the rinse liquid bath 42 to immerse the lot L in the rinse liquid, thereby being processed with the rinse liquid (S103 in FIG. 3). Thereafter, the processing mechanism 44 is raised to lift up the lot L from the first rinse liquid. Subsequently, the first transfer device 43 receives the lot L from the processing mechanism 44, and transfers the lot L to the second transfer device 52.

Next, the second transfer arm 52c of the second transfer device 52 is moved in the horizontal direction (e.g., positive side in the Y-axis direction), and is lowered from an upper side of the immersion bath 51 to immerse the lot L in the second rinse liquid (S104 in FIG. 3). A plurality of substrates W in the lot L is held in the second rinse liquid until the substrates W are lifted from the second rinse liquid by the third transfer device 53. Since the substrate W exists below the liquid surface of the second rinse liquid, the surface tension of the second rinse liquid does not act on the substrate W. and thus, the uneven pattern of the substrate W may be prevented from collapsing.

Next, the third transfer device 53 transfers the substrate W in the lot L held by the second transfer arm 52c in the second rinse liquid to the second delivery table 54. The third transfer device 53 transfers the substrate W to the second delivery table 54 one by one.

Next, the fourth transfer device 61 receives the substrate W from the second delivery table 54, and transfers the substrate W to the liquid processing device 62.

Next, the liquid processing device 62 processes the substrate W with a liquid one by one (S105 in FIG. 3). A plurality of liquids may be used, for example, pure water such as DIW, and a drying liquid having a lower surface tension than the pure water. The drying liquid may be, for example, alcohol such as IPA. The liquid processing device 62 supplies pure water and the drying liquid to the upper surface of the substrate W in this order so as to form a liquid film of the drying liquid.

Next, the fourth transfer device 61 receives the substrate W from the liquid processing device 62, and horizontally holds the substrate W such that the liquid film of the drying liquid faces upward. The fourth transfer device 61 transfers the substrate W from the liquid processing device 62 to the drying device 63.

Next, the drying device 63 dries the substrate W with the supercritical fluid one by one (S105 in FIG. 3). The drying liquid may be replaced with the supercritical fluid, and it is possible to suppress the uneven pattern of the substrate W due to the surface tension of the drying liquid from collapsing. Since the supercritical fluid requires a pressure vessel, in order to miniaturize the pressure vessel, the single-wafer processing is performed instead of the batch processing.

The drying device 63 is a single-wafer type in this embodiment, but may be a batch type as described above. The batch type drying device 63 collectively dries a plurality of substrates W on which the liquid film is formed, with the supercritical fluid. While the single-wafer type drying device 63 includes one transfer arm that holds the substrate W, the batch type drying device 63 includes a plurality of transfer arms.

Next, the fourth transfer device 61 receives the substrate W from the drying device 63, and transfers the substrate W to the first delivery table 33.

Next, the substrate feeding device 31 receives the substrate W from the first delivery table 33, and accommodates the substrate W in the cassette C (S106 in FIG. 3). The cassette C is carried out from the carry-in/out section 2 in a state of accommodating a plurality of substrates W.

(Operation of Second Interface Section)

An operation of the second interface section 5 will be described with reference to FIGS. 4 to 8. The operation of the second interface section 5 is controlled by the controller 9.

Figure 4:
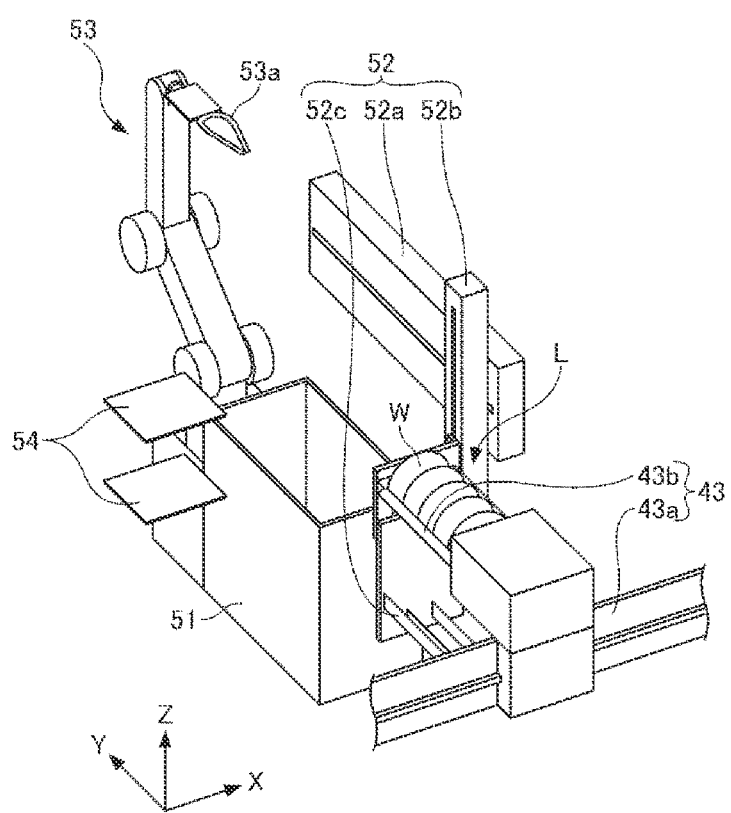
FIG. 4 is a schematic perspective view illustrating an operation of the second interface section.

First, as described in FIG. 4, the first transfer arm 43b receives the lot L from the processing mechanism 44, and is moved to the position where the lot L is delivered to the second transfer arm 52c in the negative side in the X-axis direction along the guide rail 43a. At this time, the second transfer arm 52c stands by at the standby position A3. As a result, the first transfer arm 43b may be moved to the position where the lot L is delivered to the second transfer arm 52c without being brought in contact with the second transfer arm 52c.

Figure 5:
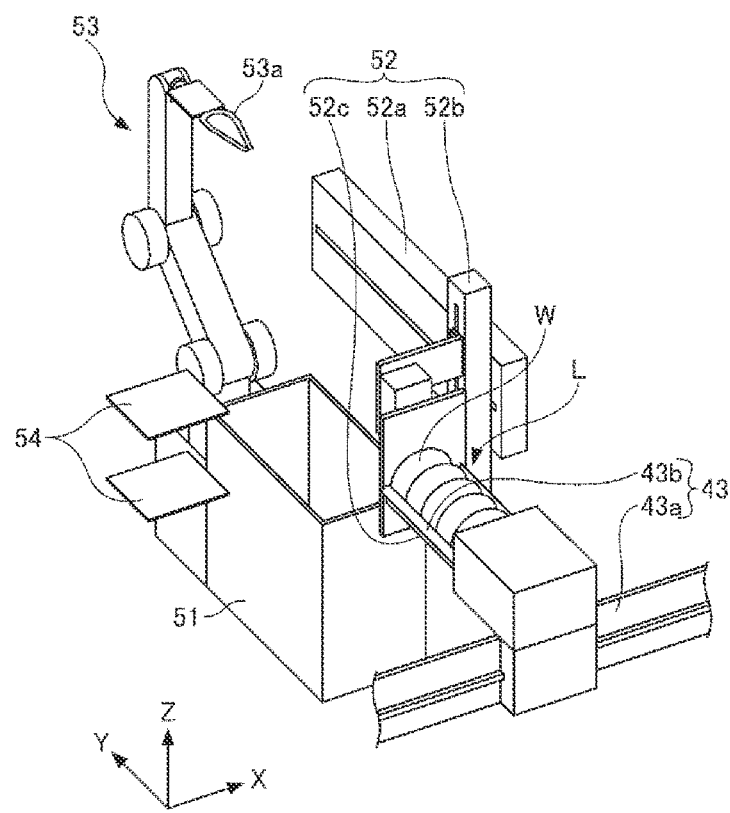
FIG. 5 is a schematic perspective view illustrating the operation of the second interface section.

Next, as illustrated in FIG. 5, the second transfer arm 52c is moved from the standby position A3 to the delivery position A1, and receives and holds the lot L from the first transfer arm 43b. That is, as illustrated by an arrow F1 in FIG. 8, the second transfer arm 52c is moved upward (e.g., positive side in the Z-axis direction) from the standby position A3, and receives the lot L from the first transfer arm 43b.

Figure 6:
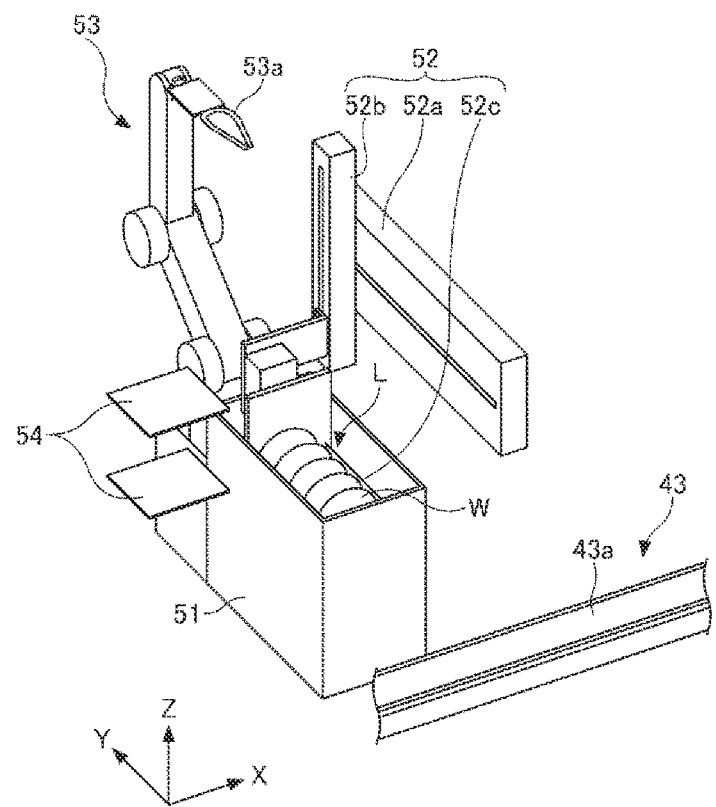
FIG. 6 is a schematic perspective view illustrating the operation of the second interface section.

Next, as illustrated in FIG. 6, the second transfer arm 52c is moved from the delivery position A1 to the immersion position A2 to immerse the lot L in the immersion bath 51. That is, as illustrated by an arrow F2 in FIG. 8, the second transfer arm 52c is moved from the delivery position A1 to the upper side of the immersion bath 51 in the horizontal direction (e.g., positive side in the Y-axis direction). Subsequently, as illustrated by an arrow F3 in FIG. 8, the second transfer arm 52c is lowered from the upper side of the immersion bath 51 to the immersion position A2 to immerse the lot L in the second rinse liquid stored in the immersion bath 51.

Figure 7:
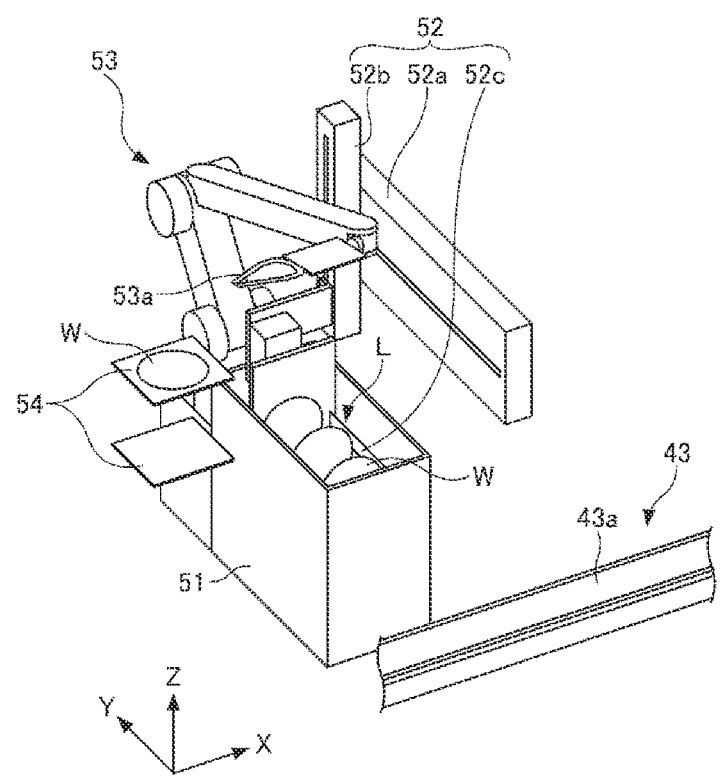
FIG. 7 is a schematic perspective view illustrating the operation of the second interface section.

Next, as illustrated in FIG. 7, the third transfer device 53 transfers the substrate W in the lot L held by the second transfer arm 52c in the second rinse liquid to the second delivery table 54. The third transfer device 53 transfers the substrate W to the second delivery table 54 one by one. At this time, since the immersion bath 51 is disposed outside the movement range of the first transfer arm 43b, the first transfer arm 43b and the third transfer arm 53a do not interfere with each other. As a result, it is possible to independently operate one of the first transfer device 43 and the third transfer device 53 regardless of the operation state of the other. That is, exclusive control becomes unnecessary. Therefore, since the first transfer device 43 and the third transfer device 53 may be operated at an arbitrary timing, it is possible to shorten the time required for transferring the substrate W. As a result, the productivity of the substrate processing system 1 is improved.

Figure 8:
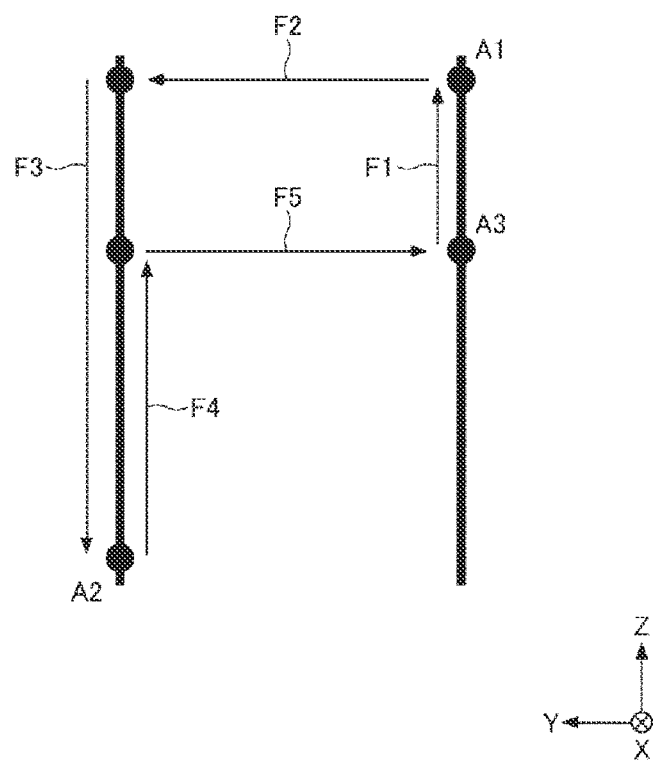
FIG. 8 is a view illustrating an operation of a second transfer device.

Next, when all the substrates W in the lot L held by the second transfer arm 52c are taken out, the second transfer arm 52c is moved to the standby position A3, and stands by until the next lot L is transferred by the first transfer arm 43b. As illustrated by an arrow F4 in FIG. 8, the second transfer arm 52c is moved upward (e.g., upper side in the Z-axis direction) from the immersion position A2 to the height the same as the standby position A3, and then, as illustrated in an arrow F5 in FIG. 8, is moved to the standby position A3 in the horizontal direction (e.g., negative side in the Y-axis direction). In this case, the second transfer arm 52c is moved to the standby position A3 via the position lower than the delivery position A1, and thus, the contact with the first transfer arm 43b may be prevented. The path along which the second transfer arm 52c is moved from the immersion position A2 to the standby position A3 may be the same as the path along which the second transfer arm 52c is moved from the standby position A3 to the immersion position A2 via the delivery position A1.

According to the second interface section 5 described above, the substrate W transferred from the batch processing section 4 to the single-wafer processing section 6 is held in the second rinse liquid until the substrate W is lifted from the second rinse liquid by the third transfer device 53. Since the substrate W exists below the liquid surface of the second rinse liquid, the surface tension of the second rinse liquid does not act on the substrate W, and thus, the uneven pattern of the substrate W may be prevented from collapsing.

(Operation of Second Delivery Table)

Details of an operation of the second delivery table 54 will be described with reference to FIGS. 9A to 9D.

Figure 9A:
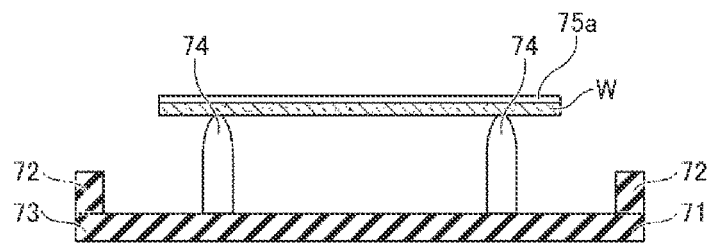
FIGS. 9A to 9D are views illustrating an operation (first operation) of the second delivery table of the first embodiment.

When the substrate W is transferred to the second delivery table 54 by the third transfer device 53, as illustrated in FIG. 9A, the substrate W is placed on the three pins 74. At this time, a liquid film 75a of the second rinse liquid has been formed on the upper surface of the substrate W.

Figure 9B:
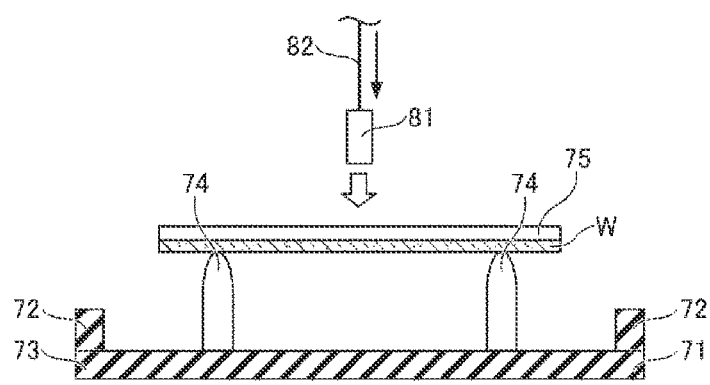

Next, as illustrated in FIG. 9B, the nozzle 81 ejects the pure water toward the upper surface of the substrate W. As a result, a liquid film 75 of the pure water is formed on the upper surface of the substrate W.

Figure 9C:
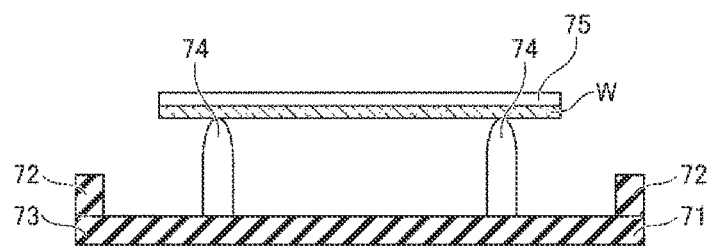

Next, as illustrated in FIG. 9C, the nozzle 81 stops the ejection of the pure water to the substrate W. The state where the liquid film 75 of the pure water is formed on the upper surface of the substrate W is maintained.

Figure 9D:
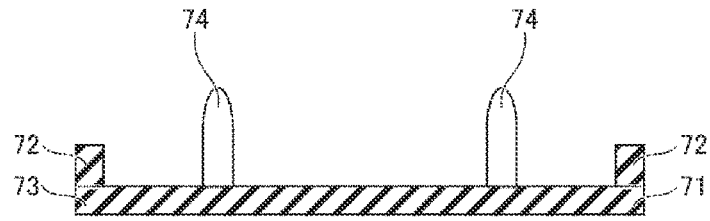

Next, as illustrated in FIG. 9D, the substrate W with the liquid film 75 of the pure water formed on the upper surface is transferred to the liquid processing device 62 by the fourth transfer device 61.

Such operation is performed on the second delivery table 54.

Even if the liquid film 75a of the second rinse liquid has been formed on the upper surface of the substrate W when the substrate W is transferred to the second delivery table 54 by the third transfer device 53, when it takes a long time for the transfer to the liquid processing device 62 by the fourth transfer device 61, the liquid film 75a may be decreased due to drying. The decrease of the liquid film 75a may cause the collapse of the uneven pattern of the substrate W. With regard to this, in the present embodiment, the liquid film 75 of the pure water is formed on the upper surface of the substrate W on the second delivery table 54, and thus, the collapse of the uneven pattern due to the drying can be suppressed.

Figure 10:
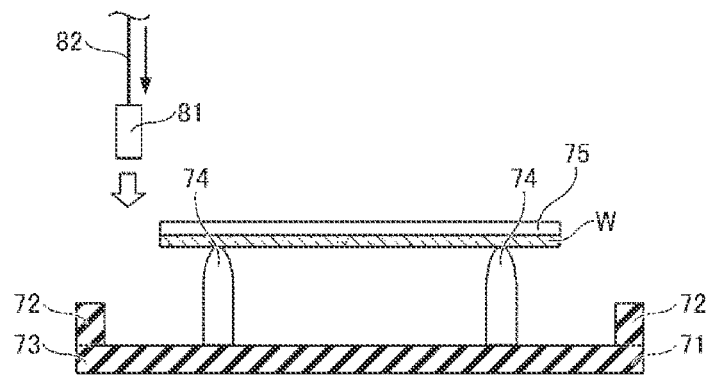
FIG. 10 is a view illustrating an operation (second operation) of the second delivery table of the first embodiment.

After forming the liquid film 75, when it takes a relatively long time for the transfer to the liquid processing device 62 by the fourth transfer device 61, that is, the standby time becomes relatively long, the liquid film 75 may be formed again. For example, the liquid film 75 may be re-formed each time a preset first time elapses from the formation of the liquid film 75. Further, when such processing is performed, the pure water stays in the portion between the branch point 85 of the pure water supply line 82 and the nozzle 81, between two consecutive formations of the liquid film 75. Therefore, as illustrated in FIG. 10, the nozzle 81 may be moved to the side of the substrate W to discharge the remaining pure water, and then, form the liquid film 75 for the second time. It is possible to suppress particles that may exist in the remaining pure water from adhering to the substrate W by discharging the remaining pure water.

Figure 11:
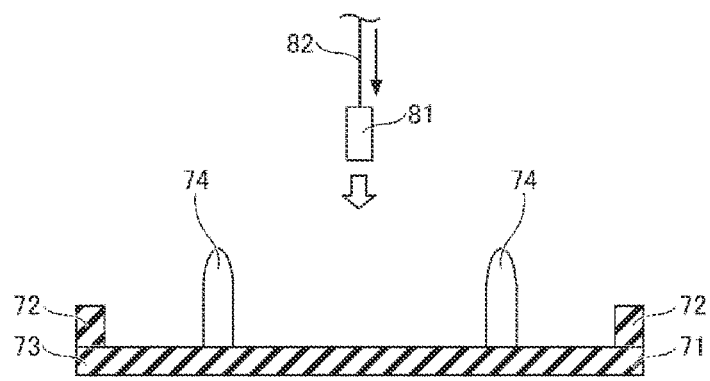
FIG. 11 is a view illustrating an operation (third operation) of the second delivery table of the first embodiment.

Further, regardless of the standby of the substrate W on the pins 74, as illustrated in FIG. 11, the pure water remaining in the portion between the branch point 85 of the pure water supply line 82 and the nozzle 81 may be discharged each time a preset second time elapses. When the substrate W is on the pins 74 during draining, as illustrated in FIG. 10, the nozzle 81 may be moved to the side of the substrate W. Further, each time the substrate W is transferred to the second delivery table 54 by the third transfer device 53, immediately before the transfer, the pure water remaining in the portion between the branch point 85 of the pure water supply line 82 and the nozzle 81 may be discharged.

Second Embodiment

Figure 12A:
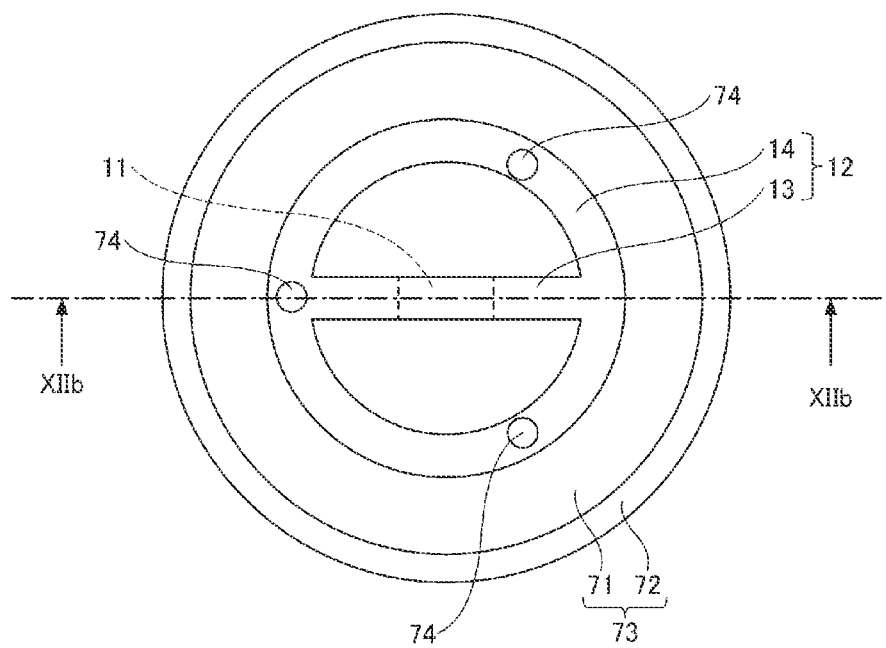
FIGS. 12A and 12B are views illustrating a second delivery table of a second embodiment.
Figure 12B:
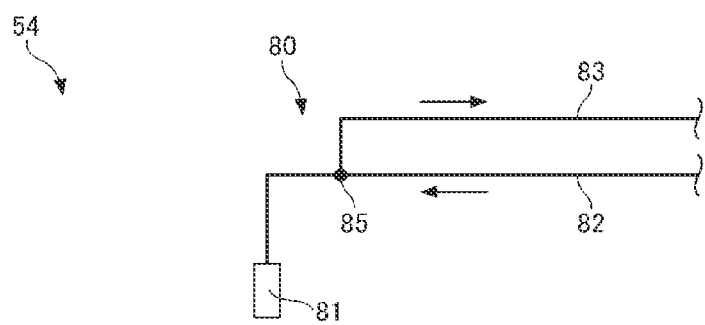
Figure 12B:
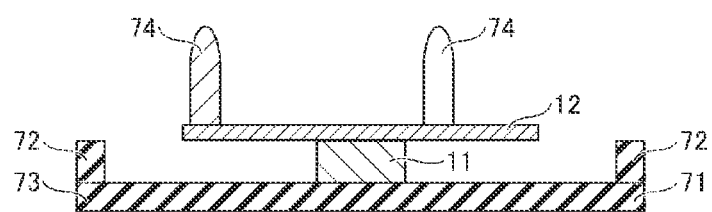

Next, a second embodiment will be described. The second embodiment is different from the first embodiment mainly in the configuration of the second delivery table 54. FIGS. 12A and 12B are views illustrating the second delivery table 54 of the second embodiment. FIG. 12A is a top view and FIG.

12B is a cross-sectional view. FIG. 12B corresponds to a cross-sectional view taken along a line XIIb-XIIb in FIG. 12A.

As illustrated in FIGS. 12A and 12B, the second delivery table 54 included in the second embodiment includes the pure water supply unit 80, the liquid receiving portion 73, the three or more pins 74, a load cell 11, and a pin support member 12. In FIG. 12A, the pure water supply unit 80 is omitted.

In the second embodiment, the load cell 11 is provided on the center portion of the bottom plate 71 of the liquid receiving portion 73, and the pin support member 12 is provided on the load cell 11. The pin support member 12 includes a beam portion 13 and an annular portion 14. The beam portion 13 is a linear member, and its center portion in the longitudinal direction is in contact with an upper surface of the load cell 11. The annular portion 14 is an annular member, and both ends of the beam portion 13 are continued to the annular portion 14. In plan view, the center of the annular portion 14 and the center of the beam portion 13 in the longitudinal direction, and the load cell 11 is positioned at the center of the annular portion 14. Then, the pins 74 are provided on the annular portion 14.

Other configurations are the same as those of the first embodiment.

In the second embodiment, when the substrate W is transferred to the second delivery table 54 by the third transfer device 53, similarly to the first embodiment, the substrate W is placed on the three pins 74 (see, e.g., FIG. 9A). At this time, the liquid film 75a of the second rinse liquid has been formed on the upper surface of the substrate W. Next, the load cell 11 measures the total mass (e.g., a first mass) of the pin support member 12, the pins 74, the substrate W, and the liquid film 75a.

Next, similarly to the first embodiment, the nozzle 81 ejects the pure water toward the upper surface of the substrate W. As a result, the liquid film 75 of the pure water is formed on the upper surface of the substrate W (see. e.g., FIG. 9B).

Next, similarly to the first embodiment, the nozzle 81 stops the ejection of the pure water to the substrate W. The state where the liquid film 75 of the pure water is formed on the upper surface of the substrate W is maintained (see, e.g., FIG. 9C). Next, the load cell 11 measures the total mass (e.g. a second mass) of the pin support member 12, the pins 74, the substrate W, and the liquid film 75. Next, the controller 9 calculates an increase amount from the first mass to the second mass, and determines whether the increase amount is within a predetermined range. The increase amount from the first mass to the second mass corresponds to the mass of the pure water supplied by the pure water supply unit 80 and remaining on the upper surface of the substrate W. A mass measurement unit 79a and the controller 9 function as a mass change detecting unit.

Similarly to the first embodiment, when the increase amount is within a predetermined range, the substrate W with the liquid film 75 of the pure water formed on the upper surface is transferred to the liquid processing device 62 by the fourth transfer device 61 (see. e.g., FIG. 9D). When the increase amount is smaller than the predetermined range (e.g., too little), for example, the nozzle 81 may eject the pure water toward the upper surface of the substrate W by the amount that is insufficient. When the increase amount is larger than the predetermined range (e.g., excessive), for example, a notification for that intent, for example, an alarm may be generated.

In the second embodiment, such operation is performed on the second delivery table 54.

According to the second embodiment, it is possible to improve the stability of the amount of the liquid film 75 formed on the substrate W transferred to the liquid processing device 62. Further, when the increase amount is too little, the pure water may drop from the upper surface of the substrate W due to the warp of the substrate W, and thus, this may be used as a trigger for checking the warp of the substrate W.

Third Embodiment

Figure 13:
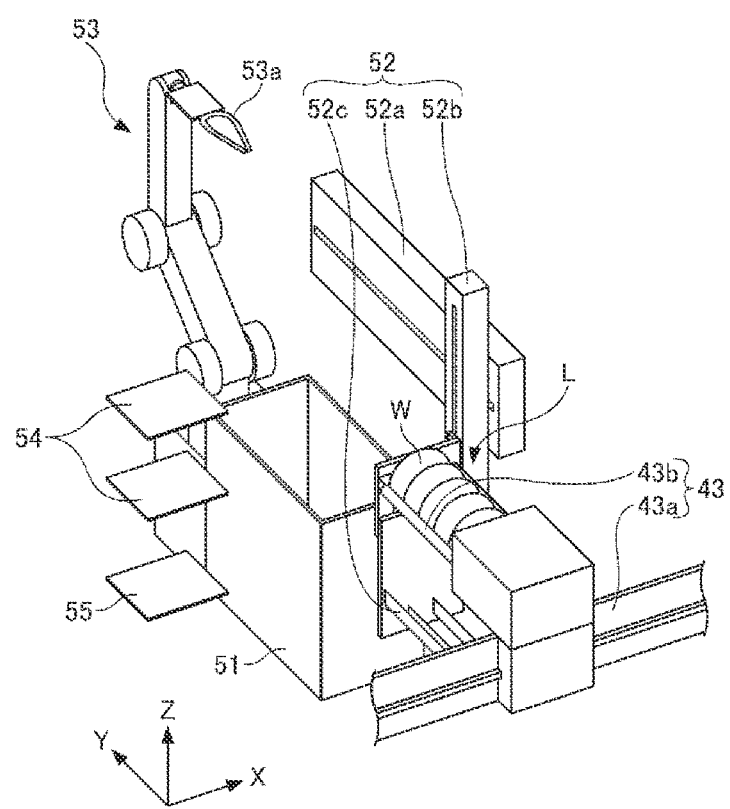
FIG. 13 is a schematic perspective view illustrating a second interface section of a third embodiment.

Next, a third embodiment will be described. The third embodiment is different from the first embodiment mainly in that the second interface section 5 includes a retraction stage. FIG. 13 is a schematic perspective view illustrating the second interface section 5 of the third embodiment.

As illustrated in FIG. 13, the second interface section 5 included in the third embodiment includes the immersion bath 51, the second transfer device 52, the third transfer device 53, the second delivery table 54, and a retraction stage 55. The retraction stage 55 is disposed on the negative side of the second delivery table 54 in the Z-axis direction. The retraction stage 55 has the same configuration as that of the second delivery table 54, and can accommodate the substrate W and eject the pure water to the upper surface of the substrate W.

Other configurations are the same as those of the first embodiment.

As described above, the fourth transfer device 61 receives the substrate W from the second delivery table 54, and transfers the substrate W to the liquid processing device 62. However, after the fourth transfer device 61 receives the substrate W from the second delivery table 54, the liquid processing device 62 may not accommodate the substrate W due to troubles. In this case, the fourth transfer device 61 transfers the substrate W to the retraction stage 55. Then, on the retraction stage 55, the pure water is ejected to the upper surface of the substrate W in order not to lose the liquid film 75 on the upper surface of the substrate W. Thereafter, when the liquid processing device 62 accommodates the substrate W, the fourth transfer device 61 receives the substrate W from the retraction stage 55, and transfers the substrate W to the liquid processing device 62.

In order to suppress the particles from adhering to the substrate W due to the stay of the pure water in the supply line of the pure water to the retraction stage 55, similarly to the second delivery table 54, the remaining pure water may be appropriately discharged.

Fourth Embodiment

Figure 14:
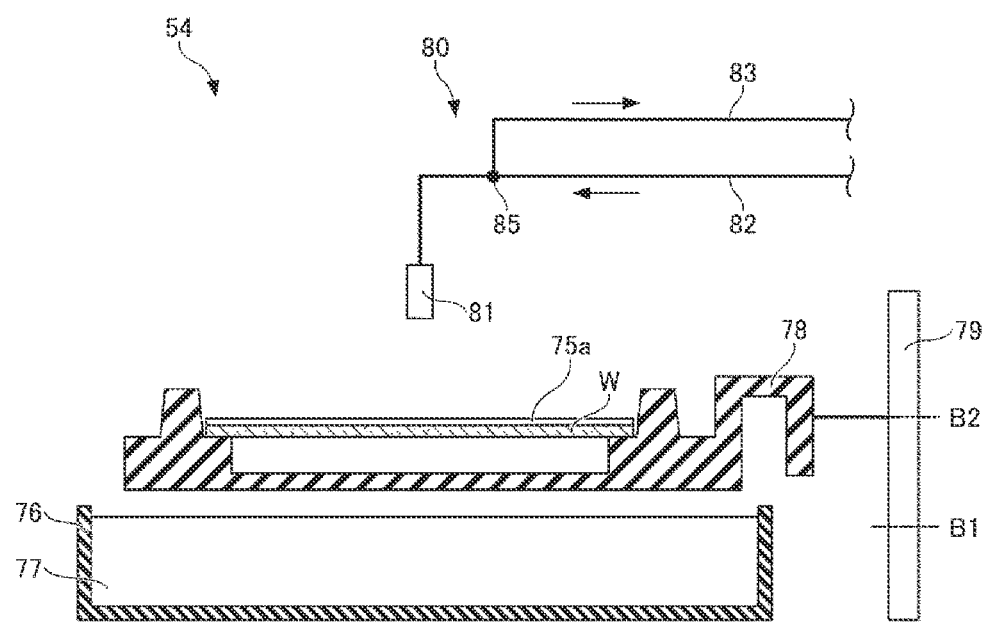
FIG. 14 is a view illustrating a second delivery table of a fourth embodiment.

Next, a fourth embodiment will be described. The fourth embodiment is different from the first embodiment mainly in the configuration of the second delivery table 54. FIG. 14 is a view illustrating the second delivery table 54 of the fourth embodiment.

As illustrated in FIG. 14, the second delivery table 54 included in the fourth embodiment includes the pure water supply unit 80, the liquid receiving portion 76, an arm 78, and a movement mechanism 79. The arm 78 horizontally holds the substrate W transferred by the third transfer device 53. The liquid receiving portion 76 is configured to store pure water 77. Further, the liquid receiving portion 76 has a depth that can immerse the substrate W held by the arm 78 in the pure water 77. The movement mechanism 79 is configured to be movable to a plurality of positions including an immersion position B1 where the substrate W is supported while being immersed in the pure water 77 stored in the liquid receiving portion 76, and a retraction position B2 where the substrate W is supported outside the pure water 77 stored in the liquid receiving portion 76. For example, the retraction position B2 is on the positive side of the immersion position B1 in the Z-axis direction. The arm 78 functions as an example of a support unit.

Other configurations are the same as those of the first embodiment.

In the fourth embodiment, when the substrate W is transferred to the second delivery table 54 by the third transfer device 53, the substrate W is placed on the arm 78. At this time, the liquid film 75a of the second rinse liquid has been formed on the upper surface of the substrate W. Next, the nozzle 81 ejects the pure water toward the upper surface of the substrate W. As a result, the liquid film 75 of the pure water is formed on the upper surface of the substrate W. Next, the nozzle 81 stops the ejection of the pure water to the substrate W. The state where the liquid film 75 of the pure water is formed on the upper surface of the substrate W is maintained. Next, the substrate W with the liquid film 75 of the pure water formed on the upper surface is transferred to the liquid processing device 62 by the fourth transfer device 61. Such operation is performed on the second delivery table 54.

Figure 15:
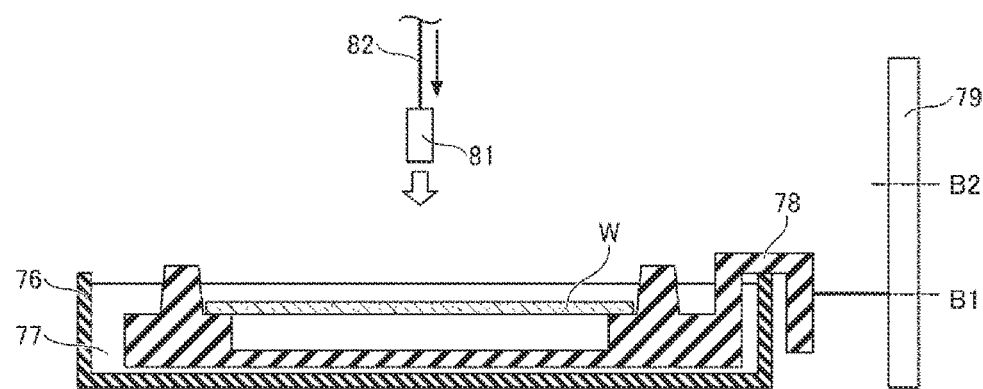
FIG. 15 is a view illustrating an operation of the second delivery table of the fourth embodiment.

Further, after forming the liquid film 75, when it takes along time for the transfer to the liquid processing device 62 by the fourth transfer device 61, that is, the standby time becomes long, as illustrated in FIG. 15, the substrate W and the arm 78 are immersed in the pure water 77 stored in the liquid receiving portion 76. For example, when a preset third time elapses from the formation of the liquid film 75, the substrate W and the arm 78 are immersed in the pure water 77 stored in the liquid receiving portion 76. At this time, at least the upper surface of the substrate W is positioned deeper than the liquid surface of the pure water 77. For example, when the preset first time elapses from the formation of the liquid film 75, such immersion processing is performed. Even when the standby time becomes long, the immersion processing may suppress the collapse of the uneven pattern caused by drying.

During the immersion processing, the pure water may be ejected continuously or intermittently from the nozzle 81 toward the substrate W. Further, a line for supplying pure water and a line for draining may be connected to the liquid receiving portion 76 so as to circulate the pure water 77.

Fifth Embodiment

Figure 16:
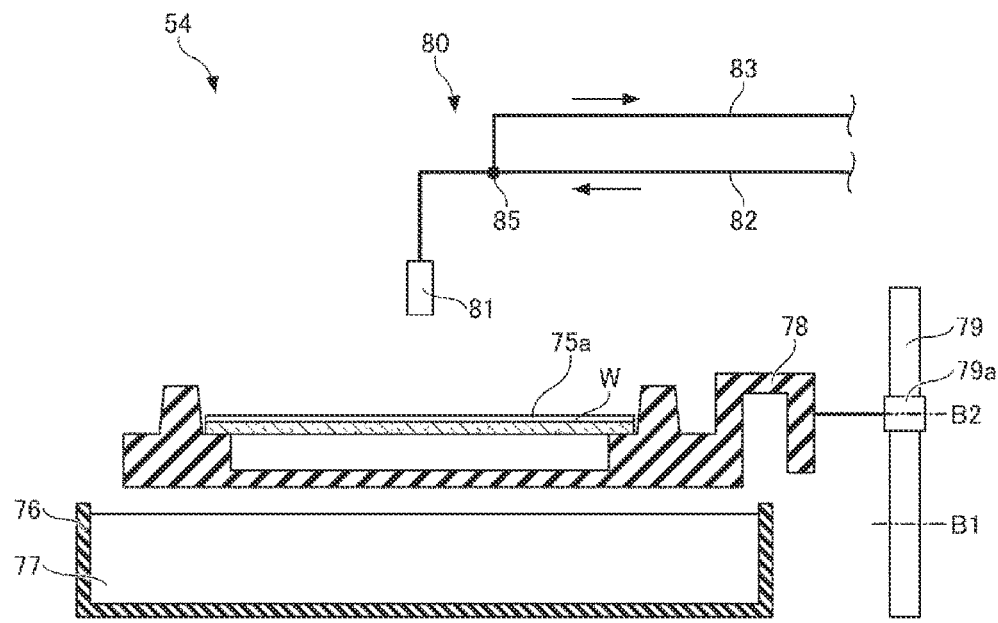
FIG. 16 is a view illustrating a second delivery table of a fifth embodiment.

Next, a fifth embodiment will be described. The fifth embodiment is different from the fourth embodiment mainly in the configuration of the second delivery table 54. FIG. 16 is a view illustrating the second delivery table 54 of the fifth embodiment.

As illustrated in FIG. 16, in the second delivery table 54 included in the fifth embodiment, the movement mechanism 79 includes the mass measurement unit 79a. The mass measurement unit 79a is provided at the retraction position B2.

Other configurations are the same as those of the fourth embodiment.

In the fifth embodiment, when the substrate W is transferred to the second delivery table 54 by the third transfer device 53, similarly to the fourth embodiment, the substrate W is placed on the arm 78. At this time, the liquid film 75a of the second rinse liquid has been formed on the upper surface of the substrate W. Next, the mass measurement unit 79a measures the total mass (e.g., a first mass) of the arm 78, the substrate W, and the liquid film 75a. Next, similarly to the fourth embodiment, the nozzle 81 ejects the pure water toward the upper surface of the substrate W. As a result, the liquid film 75 of the pure water is formed on the upper surface of the substrate W. Next, similarly to the fourth embodiment, the nozzle 81 stops the ejection of the pure water to the substrate W. The state where the liquid film 75 of the pure water is formed on the upper surface of the substrate W is maintained. Next, the mass measurement unit 79a measures the total mass (e.g., a second mass) of the arm 78, the substrate W, and the liquid film 75a. Next, the controller 9 calculates an increase amount from the first mass to the second mass, and determines whether the increase amount is within a predetermined range. The increase amount from the first mass to the second mass corresponds to the mass of the pure water supplied by the pure water supply unit 80 and remaining on the upper surface of the substrate W. The mass measurement unit 79a and the controller 9 function as a mass change detecting unit.

Similarly to the fourth embodiment, when the increase amount is within a predetermined range, the substrate W with the liquid film 75 of the pure water formed on the upper surface is transferred to the liquid processing device 62 by the fourth transfer device 61. When the increase amount is smaller than the predetermined range (e.g., too little), for example, the nozzle 81 may eject the pure water toward the upper surface of the substrate W by the amount that is insufficient. When the increase amount is larger than the predetermined range (e.g., excessive), for example, a notification for that intent, for example, an alarm may be generated.

In the fifth embodiment, such operation is performed on the second delivery table 54.

Sixth Embodiment

Figure 17:
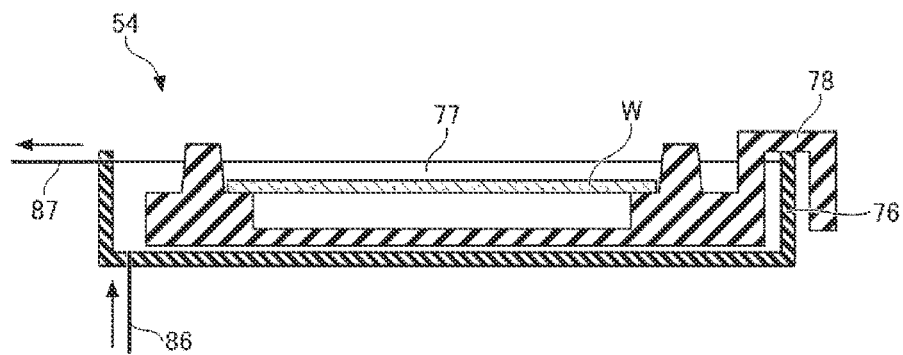
FIG. 17 is a view illustrating a second delivery table of a sixth embodiment.

Next, a sixth embodiment will be described. The sixth embodiment is different from the fourth embodiment mainly in the configuration of the second delivery table 54. FIG. 17 is a view illustrating the second delivery table 54 of the sixth embodiment.

As illustrated in FIG. 17, the second delivery table 54 included in the sixth embodiment includes the liquid receiving portion 76 and the arm 78. Further, a pure water supply line 86 and a drainage line 87 are connected to the liquid receiving portion 76.

Other configurations are the same as those of the fourth embodiment.

In the sixth embodiment, when the substrate W is transferred to the second delivery table 54 by the third transfer device 53, the substrate W is placed on the arm 78. At this time, the liquid film 75a of the second rinse liquid has been formed on the upper surface of the substrate W. Next, the substrate W and the arm 78 are immersed in the pure water 77 stored in the liquid receiving portion 76. At this time, at least the upper surface of the substrate W is positioned deeper than the liquid surface of the pure water 77. Next, the arm 78 is raised while holding the substrate W horizontally. As a result, a liquid film of the pure water is formed on the upper surface of the substrate W. Next, the substrate W with the liquid film of the pure water formed on the upper surface is transferred to the liquid processing device 62 by the fourth transfer device 61. Such operation is performed on the second delivery table 54.

In the sixth embodiment, after forming the liquid film 75, even when it takes a long time for the transfer to the liquid processing device 62 by the fourth transfer device 61, the substrate W and the arm 78 are kept being immersed in the pure water 77 stored in the liquid receiving portion 76. Therefore, even when the standby time becomes long, the collapse of the uneven pattern due to the drying can be suppressed.

The substrate W may be transferred from the chemical liquid bath 41 of the batch processing section 4 to the second delivery table 54 without passing through the rinse liquid bath 42 and the immersion bath 51, and the liquid film of the pure water may be formed on the upper surface of the substrate W on the second delivery table 54. Further, the substrate W may be directly transferred from the second delivery table 54 to the single-wafer processing section 6.

In the above embodiment, the drying device 63 dries the substrate W with the supercritical fluid, but the drying method is not particularly limited. The drying method may be any method as long as the method can suppress the collapse of the uneven pattern of the substrate W, and may be, for example, spin drying, scan drying, or water-repellent drying. In the spin drying, the substrate W is rotated to shake off the liquid film from the substrate W by centrifugal force. In the scan drying, the substrate W is rotated to shake off the liquid film from the substrate W by centrifugal force while moving the supply position of the drying liquid from the center of the substrate W toward the outer periphery of the substrate W. In the scan drying, the supply position of the drying gas such as $N_2$ gas may also be moved from the center of the substrate W toward the outer periphery of the substrate W so as to follow the supply position of the drying liquid.

(Modification 1)

Figure 18:
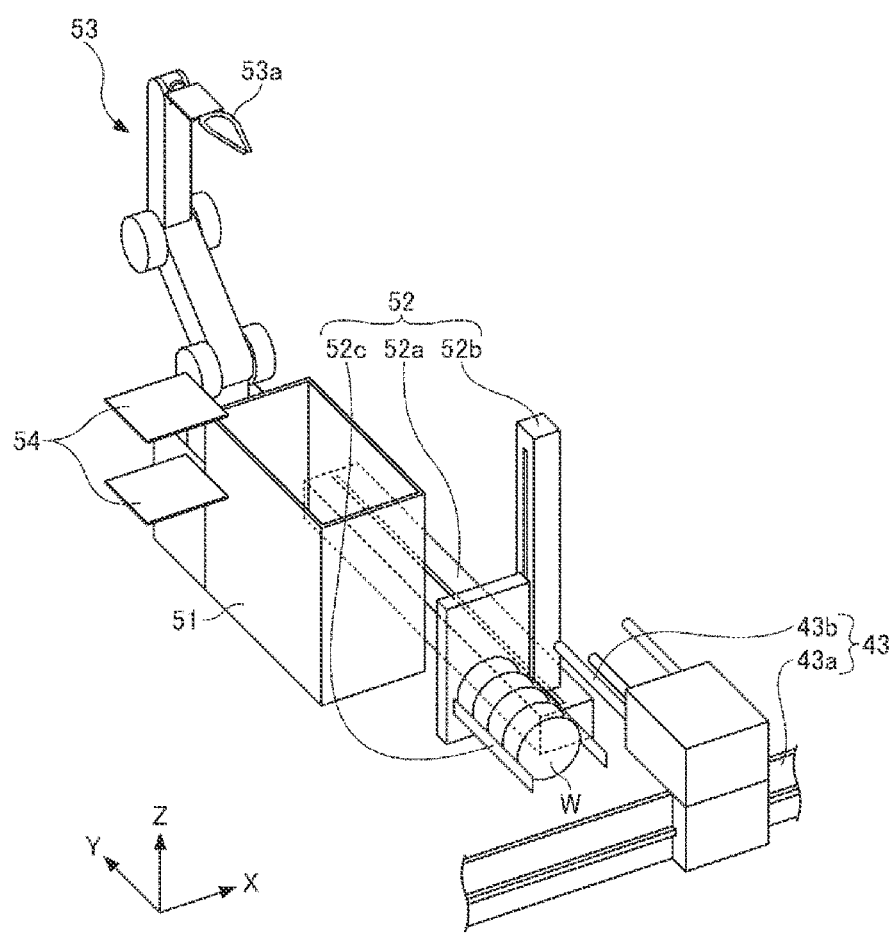
FIG. 18 is a schematic perspective view illustrating a second interface section included in Modification 1 of the first embodiment.

Next, Modification 1 of the first embodiment will be described. FIG. 18 is a schematic perspective view illustrating a second interface section 5D included in Modification 1 of the first embodiment.

As illustrated in FIG. 18, the second interface section 5D included in Modification 1 of the first embodiment is different from the second interface section 5 in that the Y-axis driving device 52a is provided on the lower side of the Z-axis driving device 52b. Other configurations of the second interface section 5D may be the same as those of the second interface section 5.

As illustrated in FIG. 18, the Y-axis driving device 52a extends from the second interface section 5D to the batch processing section 4 along the Y-axis direction on the lower side of the Z-axis driving device 52b. The Z-axis driving device 52b is attached to the positive side of the Y-axis driving device 52a in the Z-axis direction. The Z-axis driving device 52b is supported to be movable along the Y-axis direction by the Y-axis driving device 52a.

In the second embodiment, third embodiment, fourth embodiment, fifth embodiment, or sixth embodiment, the second interface section 5D may be provided instead of the second interface section 5.

(Modification 2)

Figure 19:
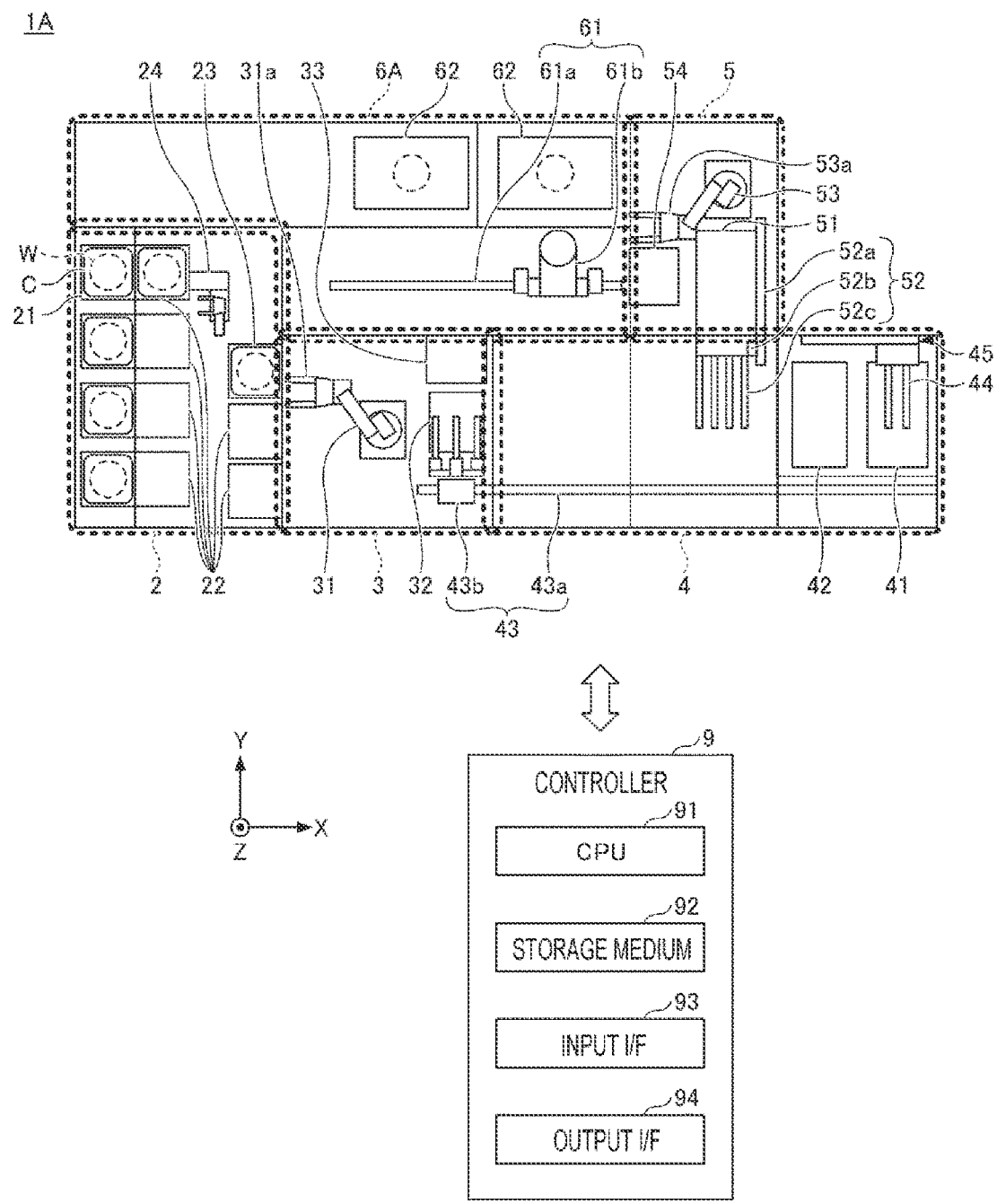
FIG. 19 is a schematic plan view illustrating a substrate processing system according to Modification 2 of the first embodiment.

Next, Modification 2 of the first embodiment will be described. FIG. 19 is a schematic plan view illustrating a substrate processing system 1A according to Modification 2 of the first embodiment. The substrate processing system 1A illustrated in FIG. 19 may be adopted when the drying method is the spin drying, scan drying, or water-repellent drying.

As illustrated in FIG. 19, in the substrate processing system 1A, the liquid processing device 62 is disposed instead of the drying device 63. That is, the substrate processing system 1A includes a single-wafer processing section 6A having the fourth transfer device 61 and the liquid processing device 62.

The liquid processing device 62 is a single-wafer type, and processes the substrate W with the processing liquid one by one. The liquid processing device 62 is configured to be capable of performing at least one of the spin drying, scan drying, and water-repellent drying. The liquid processing device 62 is disposed in a plurality of rows (e.g., two rows) in the horizontal direction (e.g., X-axis direction), and in multiple tiers (e.g., three tiers) in the vertical direction (e.g., Z-axis direction). As a result, a plurality of substrates W may be processed with the processing liquid at the same time.

The second embodiment, third embodiment, fourth embodiment, fifth embodiment, and sixth embodiment may also be applied to the substrate processing system having the configuration illustrated in FIG. 19.

According to the present disclosure, it is possible to suppress the collapse of the pattern formed on the substrate.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A substrate processing system comprising:
   a carry-in/out section in which a cassette accommodating a plurality of substrates is carried in/out;
   a batch processing section in which a wafer lot including the plurality of substrates is collectively processed in a state where each of the plurality of substrates stand upright;
   a single-wafer processing section in which the plurality of substrates included in the wafer lot are processed one by one in a horizontal state; and
   an interface section that delivers the plurality of substrates from the batch processing section to the single-wafer processing section,
   wherein the interface section includes:
   a standby table configured to horizontally hold a substrate in a state of being in contact with pure water; and
   a transfer mechanism including a transfer arm and configured to deliver the substrate from the batch processing section to the standby table.

2. The substrate processing system according to claim 1, wherein the standby table includes a pure water supply that supplies pure water to an upper surface of the substrate.

3. The substrate processing system according to claim 2, wherein the standby table includes:
   a liquid receiver that receives the pure water; and
   a support that supports the substrate from below at an above side of the liquid receiver.

4. The substrate processing system according to claim 3, wherein the liquid receiver includes:
   a bottom plate; and
   an annular wall provided on the bottom plate,
   wherein an upper end of the support is positioned above an upper end of the annular wall.

5. The substrate processing system according to claim 3, wherein the support includes three or more pins.

6. The substrate processing system according to claim 3, wherein the pure water supply supplies the pure water toward the substrate supported by the support.

7. The substrate processing system according to claim 3, wherein the pure water supply supplies the pure water to the upper surface of the substrate every time a first predetermined time elapses in a state where the substrate is supported by the support.

8. The substrate processing system according to claim 3, wherein the pure water supply includes:
- a nozzle that ejects the pure water; and
- a pure water supply line connected to the nozzle,
- wherein the nozzle ejects the pure water remaining in the pure water supply line from the nozzle every time a second predetermined time elapses.

9. The substrate processing system according to claim 3, wherein the pure water supply includes:
- a nozzle that ejects the pure water; and
- a pure water supply line connected to the nozzle,
- wherein, every time the substrate is delivered to the standby table by the transfer mechanism, the pure water remaining in the pure water supply line is ejected from the nozzle before the substrate is transferred to the standby table.

10. The substrate processing system according to claim 3, wherein the liquid receiver stores the pure water, and
- the support includes an arm capable of supporting the substrate while being immersed in the pure water stored in the liquid receiver.

11. The substrate processing system according to claim 10, wherein the arm is movable to a plurality of positions including an immersion position where the substrate is supported in a state of being immersed in the pure water stored in the liquid receiver, and a retraction position where the substrate is supported outside the pure water stored in the receiver, and
- a mover is provided to move the arm.

12. The substrate processing system according to claim 11, wherein the mover moves the arm to the immersion position when a third predetermined time elapses in a state where the substrate is supported at the retraction position by the arm.

13. The substrate processing system according to claim 2, further comprising:
- a mass change detector that measures a mass of the pure water supplied by the pure water supply and remaining on the upper surface of the substrate.

14. The substrate processing system according to claim 1, wherein the interface section includes a retraction stage that retracts the substrate after being carried out from the standby table and before being delivered to the single-wafer processing section.

15. A substrate processing method comprising:
- delivering a plurality of substrates accommodated in a wafer lot from a batch processing section in which the plurality of substrates in the wafer lot are collectively processed in a state where each of the plurality of substrates stand upright, to a single-wafer processing section in which the plurality of substrates in the wafer lot are processed one by one in a horizontal state,
- wherein the delivering includes holding the substrate horizontally in a state of being in contact with pure water.

* * * * *